United States Patent
Liang

(10) Patent No.: US 7,170,014 B1
(45) Date of Patent: Jan. 30, 2007

(54) ELECTROMAGNETIC INTERFERENCE SHIELD APPARATUS

(75) Inventor: Jen-Yu Liang Liang, Tu-Cheng (TW)

(73) Assignee: Hon Hai Precision Industry Co., Ltd. (TW)

( * ) Notice: Subject to any disclaimer, the term of this patent is extended or adjusted under 35 U.S.C. 154(b) by 0 days.

(21) Appl. No.: 11/322,072

(22) Filed: Dec. 29, 2005

(30) Foreign Application Priority Data

Jun. 18, 2005 (CN) .................... 2005 1 0035451

(51) Int. Cl.
*H05K 9/00* (2006.01)
*H02B 1/56* (2006.01)

(52) U.S. Cl. .................. 174/383; 174/377; 361/816

(58) Field of Classification Search .............. 174/35 R, 174/35 GC, 377, 382, 383; 361/816, 818, 361/800
See application file for complete search history.

(56) References Cited

U.S. PATENT DOCUMENTS

| | | | |
|---|---|---|---|
| 6,178,097 B1 | 1/2001 | Hauk, Jr. | |
| 6,388,189 B1 * | 5/2002 | Onoue | 174/35 R |
| 6,673,998 B1 * | 1/2004 | Wu | 174/383 |
| 7,088,593 B2 * | 8/2006 | Aochi | 361/818 |
| 2005/0018411 A1 * | 1/2005 | Lum et al. | 361/800 |
| 2005/0041409 A1 * | 2/2005 | Liao | 361/816 |
| 2005/0141211 A1 * | 6/2005 | Chen | 361/816 |

\* cited by examiner

*Primary Examiner*—Hung V. Ngo
(74) *Attorney, Agent, or Firm*—Morris Manning & Martin LLP; Tim Tingkang Xia, Esq.

(57) ABSTRACT

An EMI shield apparatus includes an EMI shield (10) and a heat sink (20). The EMI shield comprises a pair of first sidewalls (14), a pair of second sidewalls (16), and an interconnecting top wall (12). The top wall and the first and second sidewalls cooperatively surround a receiving space (18). An electronic component (64) is received in the receiving space to be shielded. The heat sink is mounted between the top wall and the electronic component. A pair of receiving grooves (22) is defined in opposite sides of the heat sink. At least one projection (142) is stamped into an inner face of each of the first sidewalls, the projections received in the corresponding receiving groove. The EMI shield apparatus can not only protect the electronic component from EMI, but also can effectively dissipate heat generated by the electronic component.

16 Claims, 3 Drawing Sheets

ELECTROMAGNETIC INTERFERENCE SHIELD APPARATUS

BACKGROUND

1. Field of the Invention

The present invention relates to Electromagnetic Interference (EMI) shield apparatuses, and particularly to EMI shield apparatuses used with heat dissipation devices.

2. General Background

EMI occurs between neighboring electronic components or circuitries due to inductive coupling therebetween. EMI sources include inverters, diodes, transistors, amplifiers, power supplies, and other circuits of electronic devices. The effective performance of electronic devices can be interrupted, obstructed, or degraded by EMI. One popular solution developed to avoid the occurrence of EMI is to employ a metal EMI shield to absorb as much EMI radiation energy as possible.

A conventional RF (Radio Frequency) shield 40 is shown in FIG. 4. The RF shield 40 comprises a cover 44 and a frame 48. The cover 44 is a central portion of the RF shield 40, and is surrounded and defined by a peripheral score line 42. Four corner portions of the cover 44 are bent upwardly to form four bent portions 46, for facilitating removal of the cover 44 from the frame 48 by means of a tool such as a screwdriver. However, once the cover 44 is removed from the frame 48, the RF shield 40 cannot be used again. In addition, the heat absorbed from an electronic component by the RF shield 40 generally cannot be dissipated. The resulting buildup of heat can lead to a degradation in performance of the electronic component, and may even damage or destroy the electronic component.

FIG. 5 shows another conventional EMI shield 50. The EMI shield 50 comprises a cover 52 and a frame 54. A plurality of holes 56 is defined in the cover 52, for dissipating heat generated from an electronic component (not shown) accommodated in the EMI shield 50. However, the EMI shield 50 cannot completely shield the electronic component from EMI because of the holes 56.

Therefore, a heretofore unaddressed need exists in the industry to overcome the aforementioned deficiencies and inadequacies.

SUMMARY

In an exemplary embodiment, an EMI shield apparatus comprises an EMI shield and a heat sink. The EMI shield comprises a pair of first sidewalls, a pair of second sidewalls perpendicular to the first sidewalls, and a top wall interconnecting the first sidewalls and the second sidewalls. The top wall and the first and second sidewalls cooperatively surround a receiving space. An electronic component is received in the receiving space, to be shielded therein by the EMI shield. The heat sink is mounted between the top wall and the electronic component. A pair of receiving grooves is defined in opposite sides of the heat sink. A pair of projections is stamped into an inner face of each of the first sidewalls, thereby a pair of corresponding grooves is formed in an outer face of each sidewall. The projections are received in the corresponding receiving grooves.

Compared with the conventional EMI shield, the EMI shield apparatus of the exemplary embodiment has the following advantages. Firstly, the removal of the EMI shield from the printed circuit board is facilitated. Secondly, the EMI shield apparatus is able to not only protect the electronic component from EMI, but also can effectively dissipate heat generated by the electronic component.

Other advantages and novel features will become more apparent from the following detailed description when taken in conjunction with the accompanying drawings, in which:

DETAILED DESCRIPTION OF THE EMBODIMENTS

Figure 1:
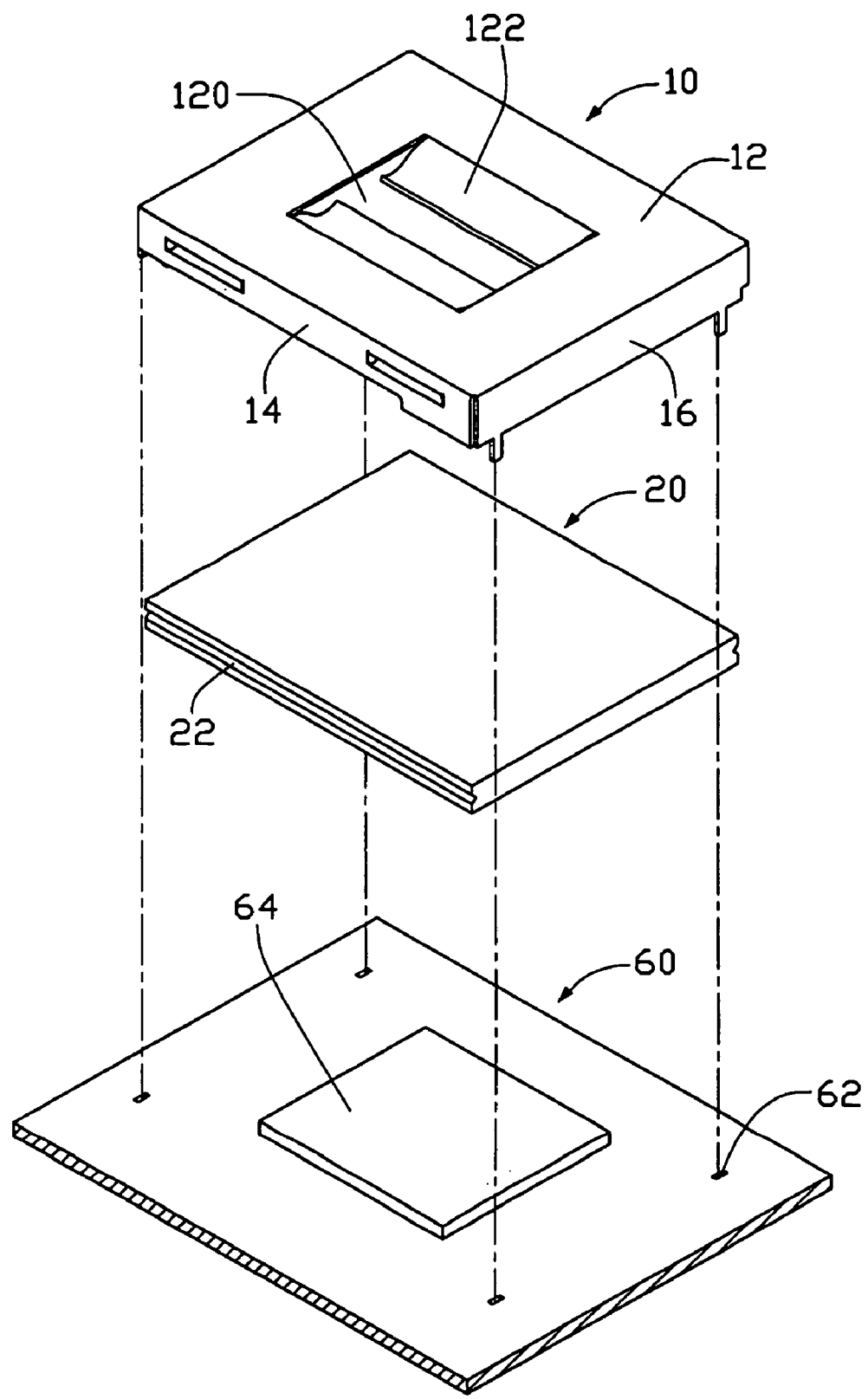
FIG. 1 is an exploded, isometric view of an EMI shield apparatus in accordance with an exemplary embodiment of the present invention, together with a printed circuit board.

Referring to FIG. 1, an EMI shield apparatus having a heat dissipation device in accordance with the exemplary embodiment of the present invention is mounted on a printed circuit board 60. The EMI shield apparatus comprises an EMI shield 10 and a heat dissipation device like a heat sink 20.

The printed circuit board 60 comprises an electronic component 64 and four mounting holes 62.

Figure 2:
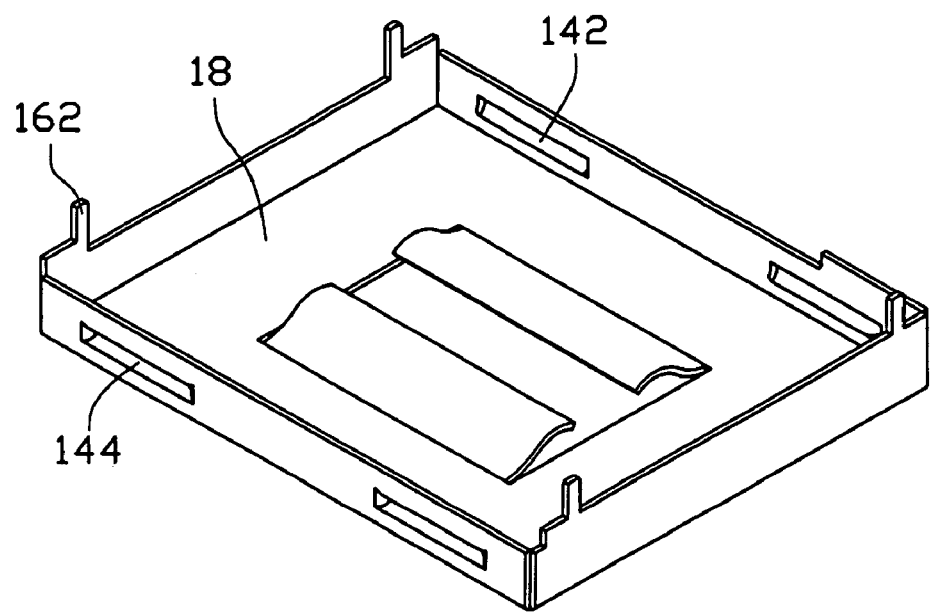
FIG. 2 is an isometric, inverted view of an EMI shield of the EMI shield apparatus of FIG. 1.

Referring also to FIG. 2, the EMI shield 10 comprises a top wall 12, a pair of opposite first sidewalls 14, and a pair of opposite second sidewalls 16. Each of the first sidewalls 14 is connected perpendicularly to each of the second sidewalls 16. The first and second sidewalls 14, 16 are connected perpendicularly to the top wall 12, respectively. The top wall 12, and the first and second sidewalls 14, 16 cooperatively surround a receiving space 18. The electronic component 64 is received in the receiving space 18. An opening 120 is defined in a middle of the top wall 12. A pair of resilient sheets 122 is formed at opposite lengthwise sides of the opening 120. Each of the resilient sheets 122 has a wavelike shape. A pair of projections 142 is stamped into an inner face of each of the first sidewalls 14, thereby a pair of corresponding grooves 144 is formed in an outer face of each first sidewall 14. The grooves 144 are for facilitating removal of the EMI shield 10 from the printed circuit board 60 by means of a tool such as a screwdriver. The projections 142 and grooves 144 are adjacent to the second sidewalls 16, respectively. A pair of mounting legs 162 extends from opposite sides of each of the second sidewalls 16, for inserting into corresponding mounting holes 62 of the printed circuit board 60 and fixing the EMI shield 10 to the printed circuit board 60.

The heat sink 20 is preferably comprised of sheet metal. An area of the heat sink 20 is slightly larger than that of the opening 120 of the EMI shield 10. Thereby, the opening 120 is sealed by the heat sink 20 after assembly. A pair of receiving grooves 22 is defined in opposite sides of the heat sink 20, for receiving the corresponding projections 142.

Figure 3:
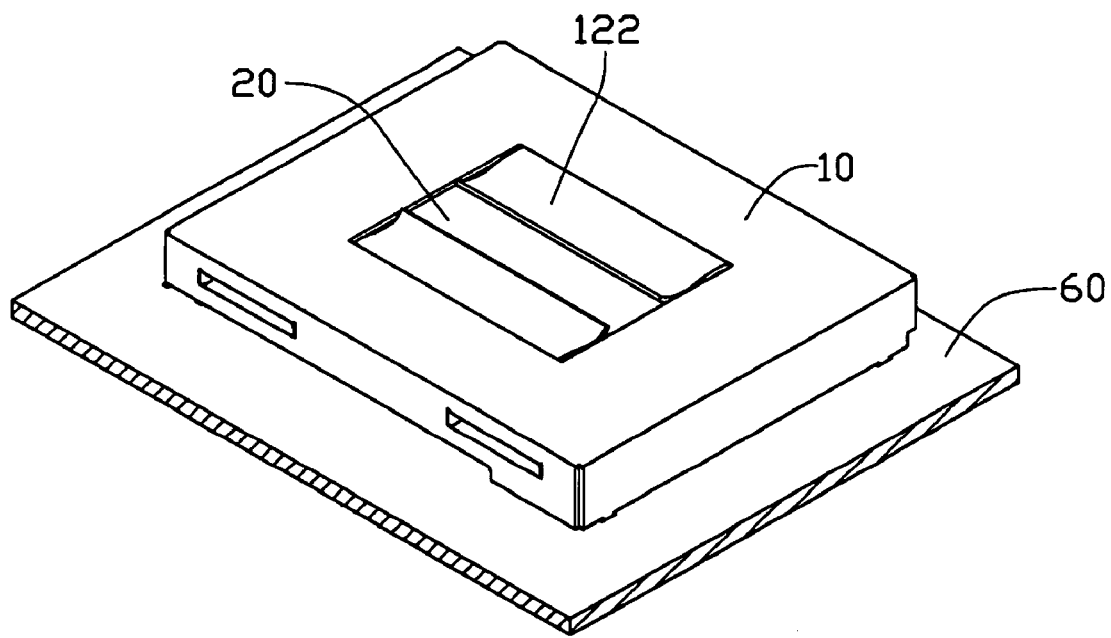
FIG. 3 is an assembled view of FIG. 1.
Figure 4:
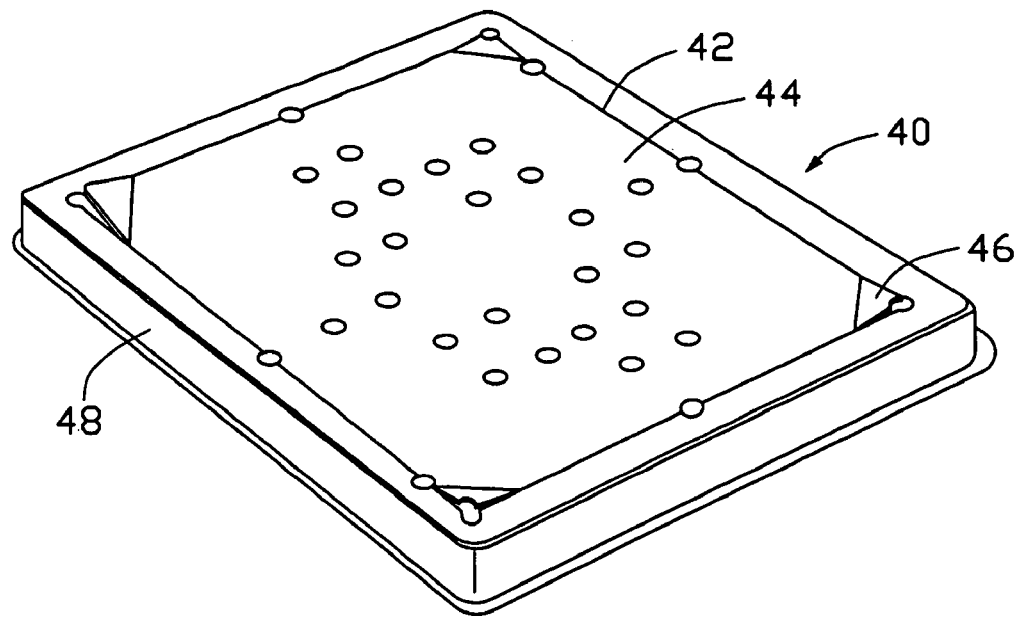
FIG. 4 is an isometric view of a conventional RF shield used in electronic devices.
Figure 5:
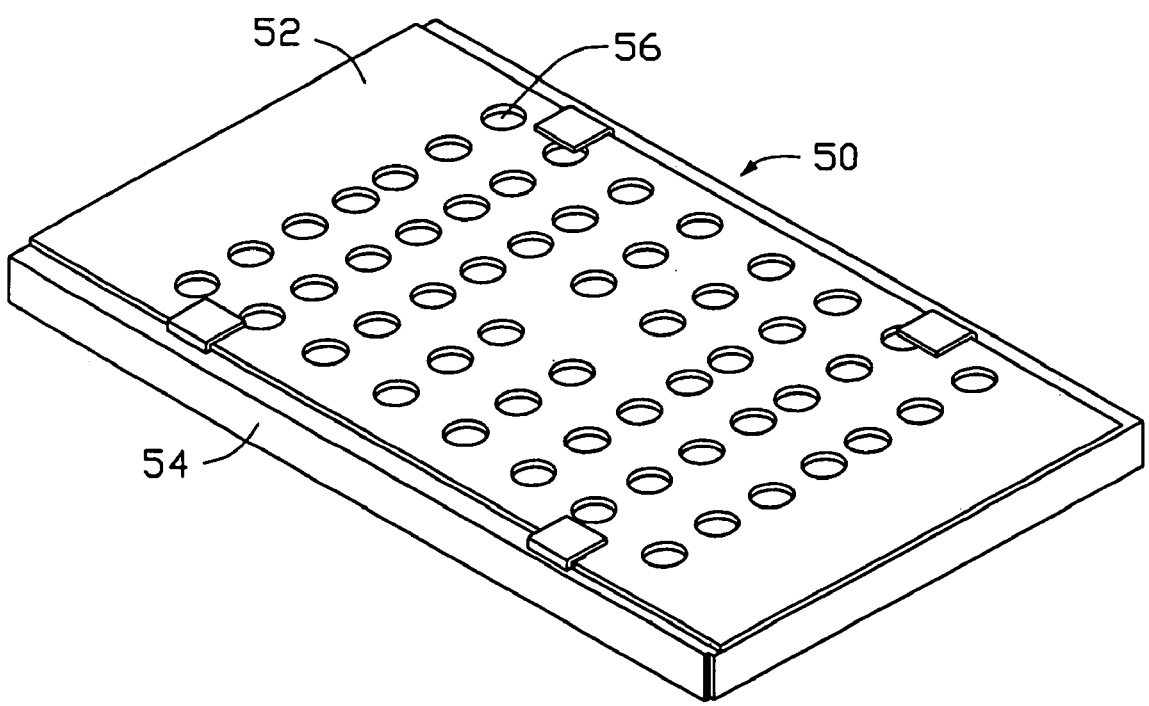
FIG. 5 is an isometric view of another type of the conventional EMI shield used in electronic devices.

Referring to FIGS. 1–3, in assembly, the heat sink 20 is received in the receiving space 18, with the projections 142 being received in the receiving grooves 22 and the resilient sheets 122 abutting against the heat sink 20. Thus, the heat sink 20 is accommodated in the EMI shield 10. Then, the EMI shield 10 together with the heat sink 20 is mounted on the printed circuit board 60 having the electronic component 64, with the mounting legs 162 being inserted into the corresponding mounting holes 62. Thereby, the electronic component 64 is received in the receiving space 18 of the EMI shield 10 to be shielded therein. In this position, the resilient sheets 122 resiliently press the heat sink 20 against the electronic component 64.

In disassembly, a pair of tools such as screwdrivers is inserted into the corresponding grooves 144 of the EMI shield 10, so that the EMI shield apparatus is disengaged from the printed circuit board 60. That is, assembling or disassembling of the EMI shield apparatus is simple.

Because the EMI shield apparatus comprises the EMI shield 10 and the heat sink 20, the EMI shield apparatus is able to not only protect the electronic component 64 received in the EMI shield 10 from EMI, but also can effectively dissipate heat generated by the electronic component.

Because of the resilient sheets 122 of the EMI shield 10, the heat sink 20 is stably received in the receiving space 18 of the EMI shield 10. In addition, the resilient sheets 122 insure that the heat sink 20 closely abuts against the electronic component 64. In particular, the wavelike configuration of the resilient sheets 122 facilitates their resilient pressing of the heat sink 20. Accordingly, the heat generated by the electronic component is efficiently dissipated. Thereby, of the electronic component 64 can provide effective performance.

While an exemplary embodiment has been described above, it should be understood that it has been presented by way of example only and not by way of limitation. Thus the breadth and scope of the present invention should not be limited by the above-described exemplary embodiment, but should be defined only in accordance with the following claims and their equivalents.

I claim:

1. An Electromagnetic Interference (EMI) shield apparatus comprising:
   an EMI shield comprising a plurality of sidewalls, and an interconnecting top wall, the sidewalls and the top wall enclosing a receiving space for receiving an electronic component to be shielded therein, at least two projections protruding from two opposite of the sidewalls respectively; and
   a heat sink mounted between the top wall and the electronic component, the heat sink being for dissipating heat generated by the electronic component, the heat sink comprising a pair of receiving grooves defined in opposite sides thereof respectively receiving the at least two projections.

2. The EMI shield apparatus as claimed in claim 1, wherein at least two grooves are defined in the opposite sidewalls respectively, the at least two grooves corresponding to the at least two projections.

3. The EMI shield apparatus as claimed in claim 1, wherein the top wall defines an opening therein, and an area of the opening is smaller than that of the heat sink.

4. The EMI shield apparatus as claimed in claim 3, wherein a pair of resilient sheets is formed at opposite sides of the opening respectively.

5. The EMI shield apparatus as claimed in claim 4, wherein each of the resilient sheets is wavelike.

6. An Electromagnetic Interference (EMI) shield apparatus assembly comprising:
   a substrate comprising an electronic component;
   an EMI shield comprising a pair of first sidewalls, a pair of second sidewalls perpendicular to the first sidewalls, and a top wall interconnecting the first sidewalls and the second sidewalls, the top wall and the first and second sidewalls cooperatively surrounding a receiving space for receiving the electronic component therein, at least one groove being formed in each of the first sidewalls for tool applying, and at least one projection being stamped into an inner face of each of the first sidewalls; and
   a heat sink mounted between the top wall and the electronic component, the heat sink being for dissipating heat generated by the electronic component, and defining two receiving grooves in opposite sides thereof respectively, the receiving grooves receiving the corresponding projections therein.

7. The EMI shield apparatus assembly as claimed in claim 6, wherein the at least one groove is formed in an outer face of each of the first sidewalls, the grooves of the first sidewalls corresponding to the projections.

8. The EMI shield apparatus assembly as claimed in claim 6, wherein the top wall defines an opening therein, and an area of the opening is smaller than that of the heat sink.

9. The EMI shield apparatus assembly as claimed in claim 8, wherein a pair of resilient sheets is formed at opposite sides of the opening respectively.

10. The EMI shield apparatus assembly as claimed in claim 9, wherein each of the resilient sheets is wavelike.

11. The EMI shield apparatus assembly as claimed in claim 6, wherein the substrate defines a plurality of mounting holes, and a plurality of mounting legs extends downwardly from each of the second sidewalls, the mounting legs being received in the corresponding mounting holes.

12. An assembly of an electronic component capable of generating heat, comprising:
   an electronic component packaged as a whole to perform function thereof;
   an Electromagnetic Interference (EMI) shield electrically surrounding and spaced from said electronic component, said shield comprising at least one projection extending toward said component; and
   a heat dissipation device removably receivable inside said shield between said shield and said component, and thermally engagable with said component so as to thermally transmit heat out of said component for further heat dissipation, said heat dissipation device comprising at least one receiving groove correspondingly receiving said at least one projection of said shield therein when said heat dissipation device is received inside said shield.

13. The assembly as claimed in claim 12, wherein said shield comprises at least one resilient sheet extending therefrom toward said heat dissipation device so as to urge pressured engagement between said heat dissipation device and said component.

14. The assembly as claimed in claim 12, wherein said shield comprises a plurality of sidewalls, said at least one projection comprises two projections, and said two projections protrude from two opposite sidewalls of said shield respectively.

15. The assembly as claimed in claim 14, wherein said at least one receiving groove of said heat dissipation device comprises two receiving grooves, and said two receiving grooves are defined in two opposite sides of said heat dissipation device respectively.

16. The assembly as claimed in claim 12, wherein a groove is defined at a location of said shield corresponding to each of said at least one projection.

* * * * *

UNITED STATES PATENT AND TRADEMARK OFFICE
CERTIFICATE OF CORRECTION

PATENT NO.        : 7,170,014 B1                                  Page 1 of 1
APPLICATION NO.   : 11/322072
DATED             : January 30, 2007
INVENTOR(S)       : Jen-Yu Liang It is certified that error appears in the above-identified patent and that said Letters Patent is hereby corrected as shown below:

On Title Page:

Item (75) Inventor, "JEN-YU LIANG LIANG" should read --JEN-YU LIANG--

Item (30) Foreign Application Priority Data, "2005 1 0035451" should read --2005 1 0035451.X--

Signed and Sealed this

Seventh Day of August, 2007

JON W. DUDAS
*Director of the United States Patent and Trademark Office*